Aug. 16, 1960 E. R. HILL ET AL 2,949,544

SWITCHING APPARATUS

Filed Oct. 4, 1957

WITNESSES:

Edwin E. Bassler

Myron E. Click

INVENTORS
Earl R. Hill and
Robert L. Klar, Jr.
BY
F. E. Browder
ATTORNEY

United States Patent Office 2,949,544
Patented Aug. 16, 1960

2,949,544

SWITCHING APPARATUS

Earl R. Hill, Cincinnati, and Robert L. Klar, Jr., Madeira, Ohio, assignors to Westinghouse Electric Corporation, East Pittsburgh, Pa., a corporation of Pennsylvania Filed Oct. 4, 1957, Ser. No. 688,342

3 Claims. (Cl. 307—88.5)

This invention relates to switching apparatus in general and in particular to switching apparatus having a synchronous output.

The advent of a semiconductor diode having such characteristics that on exceeding certain specified reverse current and voltage the diode becomes highly conductive and thereafter will carry a substantial reverse current at low voltages, has led to many new switching apparatus applications. The phenomena described above is not a Zener breakdown, nor is it an avalanche breakdown. This unique breakdown characteristic can be repeated indefinitely. This breakdown has been designated as a hyperconductive breakdown and a diode having such a characteristic will be referred to hereinafter as a hyperconductive diode.

It is an object of this invention to provide an improved switching apparatus.

It is a further object of this invention to provide improved switching apparatus for obtaining a synchronous half-cycle output from a switch that is closed asynchronously.

Further objects of this invention will become apparent in the following description as taken in conjunction with the accompanying drawing. In said drawing, for illustrative purposes only is shown the preferred embodiment of the invention.

Figure 1:
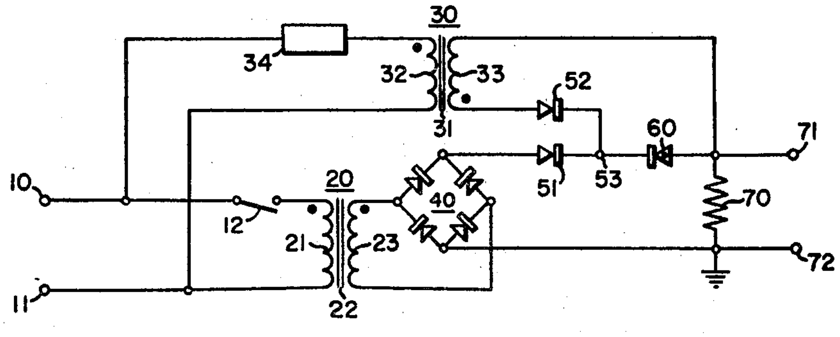
Figure 2:
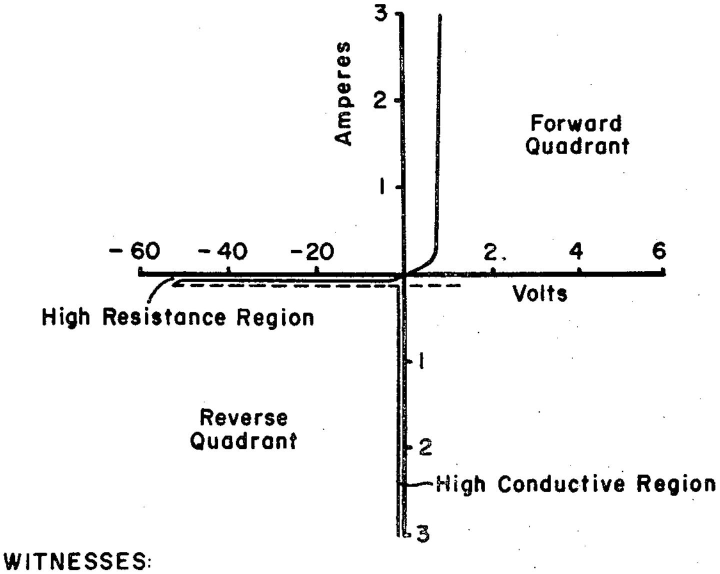

Fig. 1 is a schematic diagram of an improved switching apparatus embodying the teachings of this invention. In Fig. 1, the manner in which the windings have been wound upon the magnetic core member is indicated by the polarity dot convention indicating points of like instantaneous polarity; and Fig. 2 is a diagram of a curve plotting the operation of a hyperconductive diode.

A hyperconductive diode with controllable reversible breakdown characteristics or hyperconductive breakdown comprises a first base element which consists of a semiconductor member doped with an impurity to provide a first type of semiconductivity, either N or P. Upon this first base is an emitter consisting of semiconductor material doped with the opposite type of semiconductivity. This emitter may be prepared by alloying a pellet containing a doping impurity to a wafer of semiconductor material forming the first base. An emitter junction is present at the zone between the first base and the emitter.

In order to facilitate the connecting of the diode into an electrical circuit, a layer of silver or other good conductor metal may be fused, alloyed into or soldered with the upper surface of the emitter. Copper lead wires may be readily soldered to this layer. A second base of opposite conductivity is provided next to the first base. A zone where the first and second base meet forms a collector junction. Next to the second base is a mass of metal which is a source of carriers that play a critical part in the functioning of the diode. This mass of metal may be neutral or it may have the same doping characteristics as the second base. The mass of metal may be applied to the second base by a soldering, alloying, fusing or other similar well-known method.

Such a hyperconductive semiconductor diode, as described above, is described in detail in a copending application Serial No. 642,743, entitled "Semiconductor Diode," filed February 27, 1957, assigned to the same assignee as the present invention. For more detailed description of the construction, characteristics, and operation of such a hyperconductive diode, reference is made to the above copending application, Serial No. 642,743.

Referring to Fig. 1, there is illustrated a schematic diagram of an improved switching apparatus comprising in general a first transformer 20, a second transformer 30, full-wave rectifier 40 and a hyperconductive diode 60.

The first transformer 20 comprises a magnetic core member 21 having inductively disposed thereon a primary winding 21 and a secondary winding 23. The primary winding 21 is connected in series circuit relationship with a switching means or device 12 between a pair of input terminals 10 and 11. The secondary winding 23 is connected across the input of the full-wave rectifier 40. An isolating rectifier 51, a terminal 53, the hyperconductive diode 60, a terminal 71, an output impedance or load 70, and a terminal 72 are connected in series circuit relationship between the output terminals of the full-wave rectifier 40.

The second or pulse transformer 30 comprises a magnetic core member 31 having inductively disposed thereon a primary winding 32 and a secondary winding 33. The primary winding 32 is connected to the input terminals 10 and 11. The secondary winding 33 is connected in series circuit relationship with an isolating rectifier 52 between the terminals 53 and 71. The terminals 71 and 72 are connected to the load to which the synchronous operation is desired. A source of alternating current voltage, not shown, is to be connected to the terminals 10 and 11.

Referring to Fig. 2, there is graphically represented a curve showing how the hyperconductive diode responds to the application of different voltages. Considering the upper right or forward quadrant, when the forward voltage of the order of one voltage unit is applied, the current builds up approximately three current units. When the voltage was reversed, the voltage builds up in a reverse direction to approximately 55 voltage units with only a small fraction of current units flowing, and then the hyperconductive diode suddenly becomes highly conductive and the voltage drops to about one voltage unit as shown in the lower left or reverse quadrant. The hyperconductive diode becomes a conductor with low ohmic resistance and its current builds up rapidly to several current units.

As shown in the reverse quadrant when the diode breaks down the voltage drops along a substantially straight line to approximately one voltage unit, and very little power is dissipated in maintaining the diode highly conductive. Thus, the diode is designated as a hyperconductive diode since upon breakdown after passing through the negative resistance region, superconduction or hyperconduction of current results at very low resistance. The diode can be rendered highly resistant again by reducing the current below a minimum threshold value, and the voltage below the breakdown value of the particular hyperconductive diode. Consequently, the curve can be repeatedly followed as desired by properly controlling the magnitude of the reverse current and voltage.

Referring again to Fig. 1, the operation of the improved switching apparatus is as follows: When the switching means 12 is in an opened position, no current flows in the primary winding 21. Thus no voltage is induced in the secondary winding 23 and there is no voltage impressed upon the full-wave rectifier to cause a current flow through the isolating rectifier 51 to the hyperconductive diode 60 and the output means or impedance 70.

On each half-cycle of the alternating current voltage, to be connected to the terminals 10 and 11, there is induced a voltage in the secondary winding 33 by current flow in the primary winding 32 of the transformer 30. When the terminal 10 is at a positive polarity with respect to the terminal 11, there is induced a voltage in the secondary winding 33 of the transformer 30 to cause a current flow through the isolating rectifier 52 to the terminal 53 causing a voltage to be impressed in a reverse direction on the hyperconductive diode 60. When the terminal 10 is at a negative polarity with respect to the terminal 11, there is induced a voltage in the secondary winding 33 of the transformer 30 of an opposite polarity of the previous half-cycle. Current flow from the secondary winding 33 of the transformer 30 is blocked by the isolating rectifier 52.

Thus we have a train of pulses, a frequency of the alternating current voltage to be applied to the terminals 10 and 11, applied in a reverse direction to the hyperconductive diode 60. If the magnitude of these pulses is of sufficient value to cause a breakdown of the hyperconductive diode 60 in reverse direction, current will be allowed to flow through the hyperconductive diode 60 to the output impedance 70 from the output terminals of the full-wave rectifier 40.

When the switching means 12 is brought to a closed position, the transformer 20 has an alternating-current voltage from the secondary winding 23 induced from the current flowing in the primary winding 21. This alternating current-voltage output is rectified by the full-wave rectifier 40 into full-wave pulsating direct-current voltage. Current will flow through the isolating rectifier 51, the terminals 53, the hyperconductive diode 60, the terminal 71, the output impedance 70 and the terminal 72.

The hyperconductive diode 60 is triggered on or pulsed into the hyperconductive state at the start of each positive half-cycle of the alternating-current voltage applied at the terminals 10 and 11. Thus when the switching means 12 is closed, no output will appear across the impedance 70 unless the hyperconductive diode 60 is pulsed into the hyperconductive state by the pulses applied to the hyperconductive diode 60 through the pulse type transformer 30. This forces the half-wave output at the terminals 71 and 72 to be synchronized with the power supply or alternating-current voltage applied to the terminals 10 and 11 without regard to when the asynchronous switch is closed.

A phasing device 34 may be connected in series with the primary winding 32 in order to adjust the phase angle of the pulses to the hyperconductive diode 60. The phasing device 34 may be any one of several known to those skilled in the art.

The primary winding 32 of the pulse transformer 30 may also be connected to any other pulse source with which the output at the terminals 71 and 72 across the output impedance 70 is to be synchronized. If a half-wave, pulsating direct-current potential input is connected to the input terminals 10 and 11, the full-wave rectifier 40 may be omitted from the circuit hereinbefore described.

In conclusion, it is pointed out that while the illustrated example shows a practicable embodiment of our invention, we do not limit ourselves to the exact details shown, since modification of the same may be varied without departing from the spirit of the invention.

We claim as our invention:

1. In a switching apparatus, in combination; transformer means, full wave rectifier means connected across the output of said transformer means, switching means, hyperconductive diode means and means for connecting a pulse source across said hyperconductive diode means in a reverse conduction direction; said transformer means coupling means for connecting an input pulsating potential source to means for connecting a load; said switching means being connected to interrupt the transformation of said input pulsating potential source by said transformer means; said hyperconductive diode means being serially connected with said means for connecting a load; said pulse source supplying pulses having a magnitude greater than the hyperconductive breakdown voltage of said hyperconductive diode means; said hyperconductive diode means having a controllable reversible breakdown characteristic; said characteristic allowing a large reverse current flow at a voltage substantially less than said breakdown voltage of said hyperconductive diode after said breakdown voltage has been attained; said switching apparatus being operative to supply said load with a pulsating potential in synchronism with said pulse source upon asynchronous closing of said switching means.

2. In a switching apparatus, in combination; transformer means, full wave rectifier means connected across the output of said transformer means, switching means, hyperconductive diode means and means for connecting a pulse source across said hyperconductive diode means in a reverse conduction direction; said transformer means coupling means for connecting an input pulsating potential source to means for connecting a load; said switching means being connected to interrupt the transformation of said input pulsating potential source by said transformer means; said hyperconductive diode means being serially connected with said means for connecting a load; said means for connecting a pulse source across said hyperconductive diode including a pulse transformer having an isolating rectifier means serially connected with a secondary winding of said transformer; said pulse source supplying pulses having a magnitude greater than the hyperconductive breakdown voltage of said hyperconductive diode means; said hyperconductive diode means having a controllable reversible breakdown characteristic; said characteristic allowing a large reverse current flow at a voltage substantially less than said breakdown voltage of said hyperconductive diode after said breakdown voltage has been attained; said switching apparatus being operative to supply said load with a pulsating potential in synchronism with said pulse source upon asynchronous closing of said switching means.

3. In a switching apparatus, in combination; transformer means, full wave rectifier means connected across the output of said transformer means, switching means hyperconductive diode means and means for connecting a pulse source across said hyperconductive diode means in a reverse conduction direction; said transformer means coupling means for connecting an input pulsating potential source to means for connecting a load; said switching means being connected to interrupt the transformation of said input pulsating potential source by said transformer means: said hyperconductive diode means being serially connected with said means for connecting a load; said means for connecting a pulse source across said hyperconductive diode including a pulse transformer having an isolating rectifier means serially connected with a secondary winding of said pulse transformer; said pulse source supplying pulses having a magnitude greater than the hyperconductive breakdown voltage of said hyperconductive diode means; said hyperconductive diode means having a controllable reversible breakdown characteristic; said characteristic allowing a large reverse current flow at a voltage substantially less than said breakdown voltage of said hyperconductive diode after said breakdown voltage has been attained; rectifier means serially connected with said means for connecting a load to said transformer, said rectifier means being polarized to isolate said transformer means from said pulse source means; said switching apparatus being operative to supply said load with a pulsating potential in synchronism with said pulse source upon asynchronous closing of said switching means.

References Cited in the file of this patent

UNITED STATES PATENTS

| | | |
|---|---|---|
| 2,737,601 | McMahon | Mar. 6, 1956 |
| 2,777,956 | Kretzmer | Jan. 15, 1957 |

FOREIGN PATENTS

| | | |
|---|---|---|
| 165,098 | Australia | July 1, 1954 |

OTHER REFERENCES

Handbook of Semiconductor Electronics by Hunter, McGraw-Hill Book Co., October 15, 1956, Library of Congress Catalogue Card No. 56–6896.

"Negative Resistance in Germanium Diodes," James Kauke Radio-Electronic Engineering, p. 8010, April 1953.

"Applications of Silicon Junction Diodes," Cornell-Dubilier Electric Corp., vol. 22, No. 5, May 1957.

The International Dictionary of Physics and Electronics, D. Van Nostrand Co., Inc., Princeton, New Jersey, August 1956.